United States Patent
McDonagh

(10) Patent No.: US 6,239,634 B1
(45) Date of Patent: May 29, 2001

(54) APPARATUS AND METHOD FOR ENSURING THE CORRECT START-UP AND LOCKING OF A DELAY LOCKED LOOP

(75) Inventor: Stephen McDonagh, Carraroe (IE)

(73) Assignee: Parthus Technologies (GB)

( * ) Notice: Subject to any disclaimer, the term of this patent is extended or adjusted under 35 U.S.C. 154(b) by 0 days.

(21) Appl. No.: 09/480,848

(22) Filed: Jan. 10, 2000

Related U.S. Application Data
(60) Provisional application No. 60/134,939, filed on May 19, 1999.

(51) Int. Cl.[7] .................................................. H03L 7/06
(52) U.S. Cl. .......................... 327/158; 327/198; 327/161
(58) Field of Search .................................. 327/270, 271, 327/276, 277, 284, 149, 153, 161, 198

(56) References Cited

U.S. PATENT DOCUMENTS

| | | | |
|---|---|---|---|
| 4,503,536 | 3/1985 | Panzer ................................. | 214/732 |
| 4,542,354 | 9/1985 | Robinton et al. ..................... | 341/143 |
| 4,805,192 | 2/1989 | Confalonieri et al. ............... | 375/242 |
| 4,974,184 | 11/1990 | Avra ..................................... | 708/252 |
| 5,072,195 * | 12/1991 | Graham et al. ......................... | 331/2 |
| 5,202,978 | 4/1993 | Nozuyama .............................. | 714/30 |
| 5,223,755 * | 6/1993 | Rickley ................................. | 327/158 |
| 5,329,252 * | 7/1994 | Major .................................... | 331/15 |
| 5,561,660 | 10/1996 | Kotowski et al. .................... | 370/215 |
| 5,572,099 * | 11/1996 | Carobolante .......................... | 318/434 |
| 5,721,547 | 2/1998 | Longo ................................... | 341/118 |
| 5,854,575 | 12/1998 | Fiedler et al. ........................ | 331/10 |
| 5,936,900 | 8/1999 | Hii et al. .............................. | 365/201 |
| 5,994,934 * | 11/1999 | Yoshimura et al. .................. | 327/158 |

OTHER PUBLICATIONS

"Optimization of Phase–Locked Loop Performance In Data Recovery Systems", Ramon S. Co & J.H. Mulligan, Jr., IEEE Journal of Solid–State Circuits, vol. 29, No. 9, 09/94, pp. 1022–1033.

"Basic Opamp Design and Compensation", David Johns, et al., pp. 221–255, 1997.

"Low–Jitter Process–Independent DLL and PLL Based on Self–Biased Techniques", John G. Maneatis, IEEE Journal of Solid–State Circuits, vol. 31, No. 11, 11/96, pp. 1723–1732.

"Monolithic Phase–Locked Loops And Clock Recovery Circuits: Theory and Design", Behzad Razavi, 1996, pp. iii–xi and 1–498.

"A 155–MHz Clock Recovery Delay–and Phase–Locked Loop", Thomas H. Lee, IEEE Journal of Solid–State Circuits, vol. 27, No. 12, Dec. 1992, pp. 1736–1745.

* cited by examiner

Primary Examiner—Timothy P. Callahan
Assistant Examiner—Quan Tra
(74) Attorney, Agent, or Firm—Blakely, Sokoloff, Taylor & Zafman

(57) ABSTRACT

A delay locked loop (DLL) is described comprising: a delay unit configured to delay an input clock signal by a specified amount to produce a delayed clock signal, said specified amount controlled by a control voltage applied to said delay unit; and a switch configured to clamp said control voltage to a predetermined value when said DLL is reset.

33 Claims, 8 Drawing Sheets

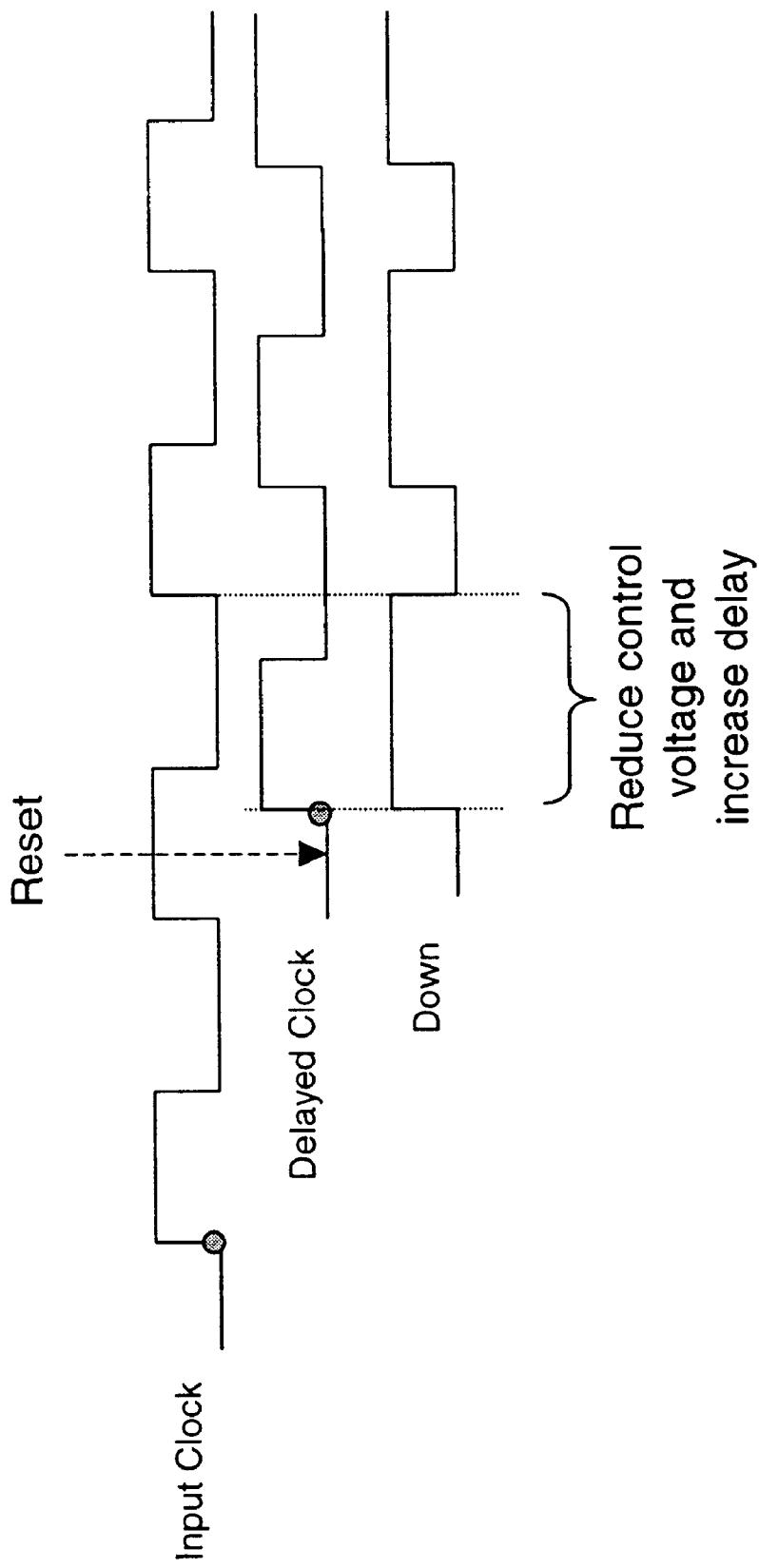
FIG. 2d *(prior art)*

APPARATUS AND METHOD FOR ENSURING THE CORRECT START-UP AND LOCKING OF A DELAY LOCKED LOOP

PRIORITY

This application claims the benefit of the filing date for U.S. Provisional Application No. 60/134,939, filed May 19, 1999.

BACKGROUND OF THE INVENTION

1. Field of the Invention

This invention relates generally to the field of analog circuit design. More particularly, the invention relates to an apparatus and method for ensuring the proper timing of a delay locked loop.

2. Description of the Related Art

Delay locked loops ("DLLs") are used extensively in the fields of analog circuit design. With the increasingly stringent timing requirements of high performance computing and communications systems today, DLLs are also frequently being used for digital circuit designs (e.g., computer motherboards, high performance multimedia boards . . . etc).

The design goal of a DLL is to generate a clock which is delayed by a specified number of clock periods with respect to the input clock. For this reason, DLLs are commonly used in applications which require clock-skew elimination, clock/data recovery and multi-phase clock generation.

FIG. 1 illustrates a block diagram of a traditional DLL circuit. The input clock 105, passes through a voltage controlled delay line ("VCDL") 110 which generates a delayed version ("CLK$_{out}$") 120 of the input clock 105. The delay in the VCDL 110 must be set precisely to some multiple of the input clock 105 period (e.g., 2×, 3×, etc., depending on the application). The delay through the VCDL 110 is controlled by a control voltage 115. The higher the control voltage 115, the shorter the delay between the input 105 and output 120 clocks.

The control voltage 115 (and, therefore, the amount of delay in the VCDL 110) is modified by a feedback loop which consists of a phase detector 125, a charge pump 130 and a capacitor 135. The phase detector 125 detects the actual time delay (i.e., the phase difference) between the input clock 105 and the output clock 120 and, in response, causes the charge pump 130 to generate either a positive or a negative current pulse. A positive pulse charges the capacitor 135, increasing the control voltage 115, and a negative pulse discharges the capacitor 135, decreasing the control voltage 115. Accordingly, if the delay of the output clock 120 is too high, the charge pump 130 provides a positive current pulse (increasing the control voltage 115), and if the delay is too short, the charge pump 130 provides a negative current pulse (decreasing the control voltage).

The feedback loop will settle when the delayed clock 120 is at the desired phase multiple of the input clock 105 (i.e. the delay is 1, 2, 3, etc. input clock periods).

SUMMARY OF THE INVENTION

A delay locked loop (DLL) is described comprising: a delay unit configured to delay an input clock signal by a specified amount to produce a delayed clock signal, said specified amount controlled by a control voltage applied to said delay unit; and a switch configured to clamp said control voltage to a predetermined value when said DLL is reset.

BRIEF DESCRIPTION OF THE DRAWINGS

A better understanding of the present invention can be obtained from the following detailed description in conjunction with the following drawings, in which:

FIGS. 2(d)–(e) illustrates timing problems associated with resetting traditional delay locked loops.

DETAILED DESCRIPTION OF THE PREFERRED EMBODIMENT

In the following description, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form to avoid obscuring the underlying principles of the invention.

Embodiments of the present invention include various steps, which will be described below. The steps may be embodied in machine-executable instructions or, alternatively, these steps may be performed by specific hardware components that contain hardwired logic for performing the steps (e.g., an integrated circuit), or by any combination of programmed computer components and custom hardware components.

Elements of the present invention may also be provided as a machine-readable medium for storing machine-executable instructions or other types of code/data (e.g., VHDL code). The machine-readable medium may include, but is not limited to, floppy diskettes, optical disks, CD-ROMs, and magneto-optical disks, ROMs, RAMs, EPROMs, EEPROMs, magnet or optical cards, propagation media or other type of media/machine-readable medium suitable for storing code/data. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

ONE EMBODIMENT OF THE APPARAUS AND METHOD FOR ENSURING THE CORRECT START-UP AND LOCKING OF A DELAY LOCKED LOOP

Figure 1:
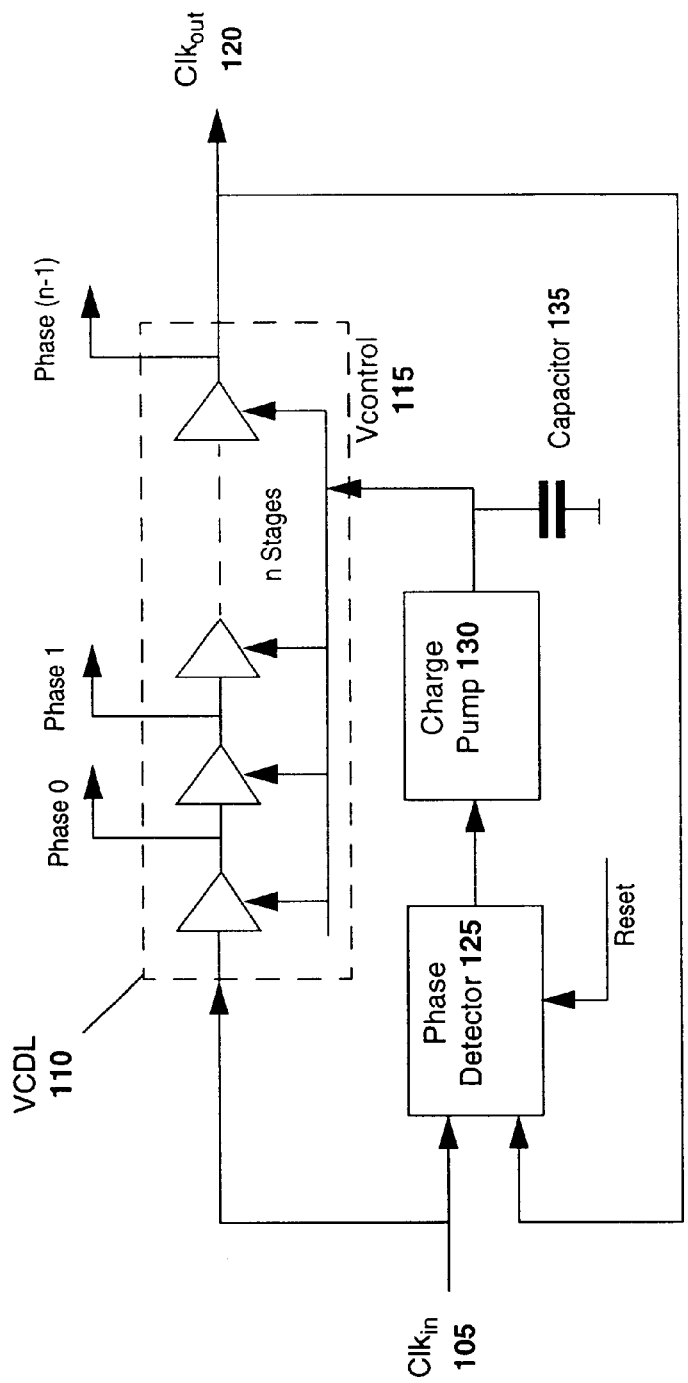
FIG. 1 illustrates a traditional delay locked loop.

There are situations where a DLL can enter a state of 'false' lock. Referring again to FIG. 1, this is where the delay in the VCDL 110 is an undesired multiple of the input clock period. For example, the desired phase delay of the output clock may be one period and the DLL may attempt to lock to a two period phase delay. A related problem is that traditional DLLs may attempt to lock to a zero delay.

For the remainder of the detailed description, it will be assumed that the desired phase delay of the output clock 120 is one period relative to the input clock 105. However, it should be noted that the underlying principles of the present invention may be implemented on systems where the desired phase delay is greater than one period of the input clock.

Figures 2A, 2B, 2C:
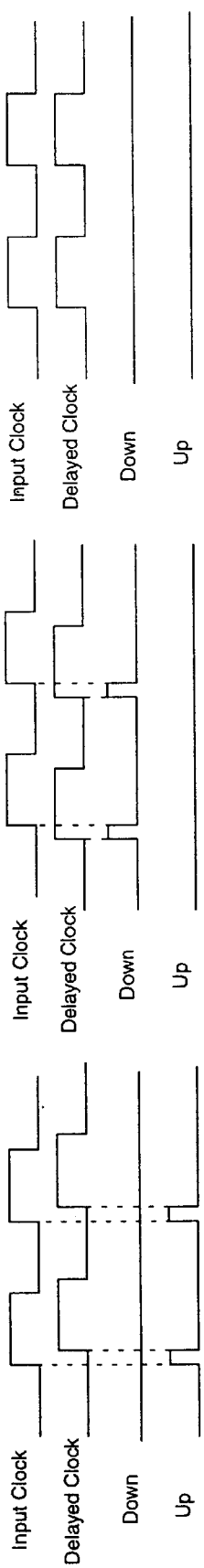
FIGS. 2(a)–(c) illustrates charge pump operation in a traditional delay locked loop.

The nature of the problems associated with improper DLL locking can be described more thoroughly by investigating the phase detector 125 operation. As illustrated in FIG. 2a, if the delayed clock is lagging the input clock, the phase detector 125 and charge-pump 130 will increase the capacitor 135 voltage, thereby decreasing the VCDL 110 delay. The illustrated 'up' pulse will get smaller and smaller until equilibrium is reached. At this point, as illustrated in FIG. 2c, both the input and delayed clocks are in phase and no more corrections are performed.

Alternatively, if the delayed clock 120 leads the input clock 105 as illustrated in FIG. 2b, the phase detector 125 and charge pump 130 will decrease the capacitor voltage 115, which increases the VCDL 110 delay. This 'down' pulse will get smaller and smaller until, once again, equilibrium is reached.

If the delay in the VCDL 110 is an improper multiple (e.g., 3×) of the input clock 105 period, the inputs to the phase detector 125 will still be in phase, notwithstanding the fact that the phase is actually off by multiple clock periods. Thus, the DLL appears to be properly locked. There are at least two mechanisms which can create false locking.

First, if the initial capacitor voltage is too low, the VCDL 110 delay could be greater than two clock periods. The phase detector will then only correct the VCDL 110 to the nearest integer multiple. Once that point is reached the DLL does not perform any more corrections (i.e., as illustrated in FIG. 2c).

Second, if the initial sequence to the phase detector 125 on start-up is incorrect, the phase detector 125 will lock the DLL with the closest multiple of the input clock period. For example, as illustrated in FIG. 2d, if the initial delay (i.e., at reset) is between one and two clock periods and the first edge the phase detector 125 encounters after reset is the delayed clock 120, the loop continually increase the delay in order to gain lock. In this particular case, when the delay equals two input clock periods the DLL stops performing corrections (i.e., FIG. 2c).

Figure 2E:
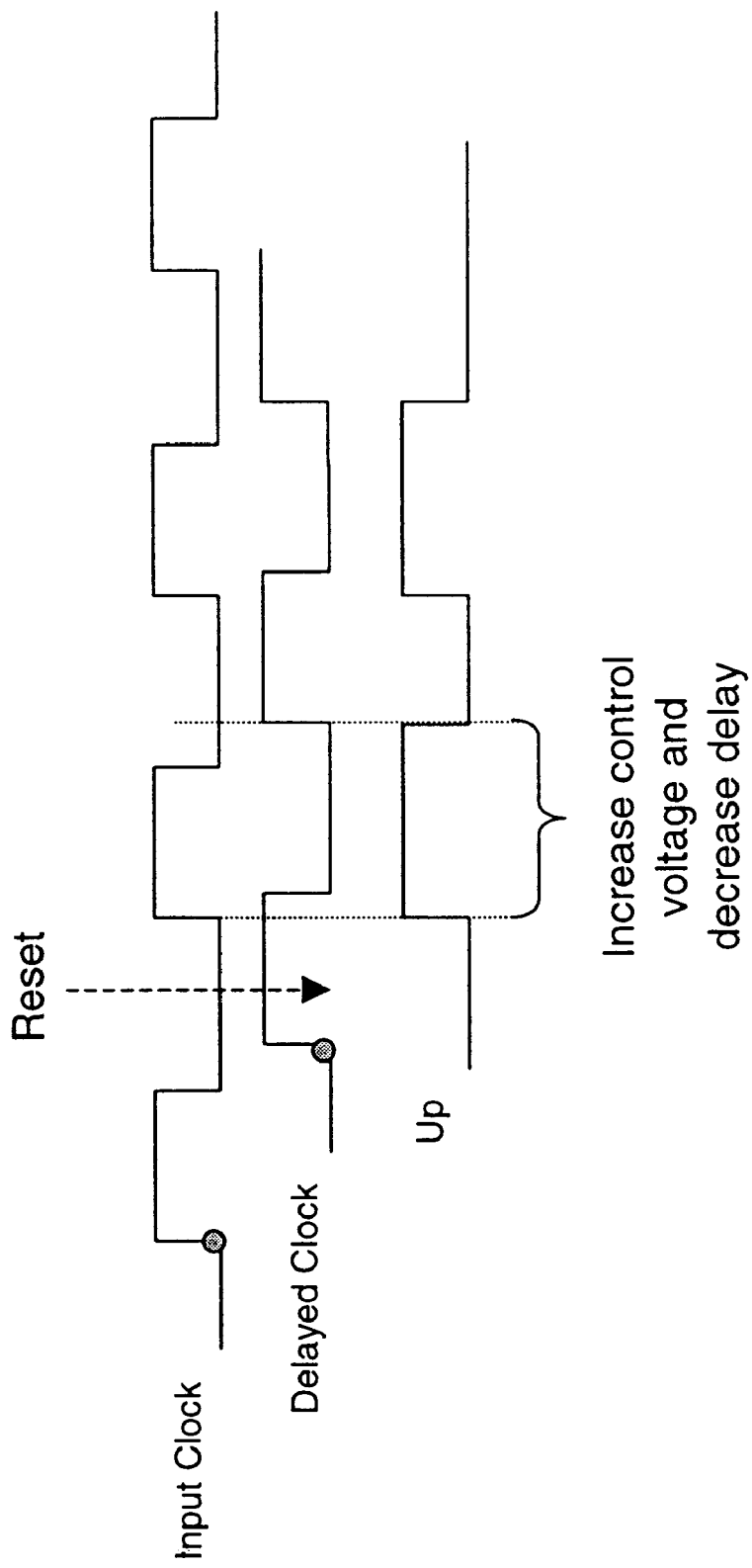

Similarly, if the VCDL 110 delay is less than one period and if the phase detector 125 first encounters the input clock 105 after reset, as illustrated in FIG. 2e, the loop will keep decreasing the delay in order to gain lock, and the DLL will attempt to lock to zero delay. This situation is not possible and the DLL will never lock.

In one embodiment of the invention, to avoid false locking, the DLL is brought out of reset properly to ensure that the delay to which the VCDL 110 locks exactly equals one input clock 105 period (i.e., if one clock period is the design goal). This embodiment examines the control voltage and/or the VCDL 110 clocks to detect false lock conditions and then corrects the DLL state.

Figure 3:
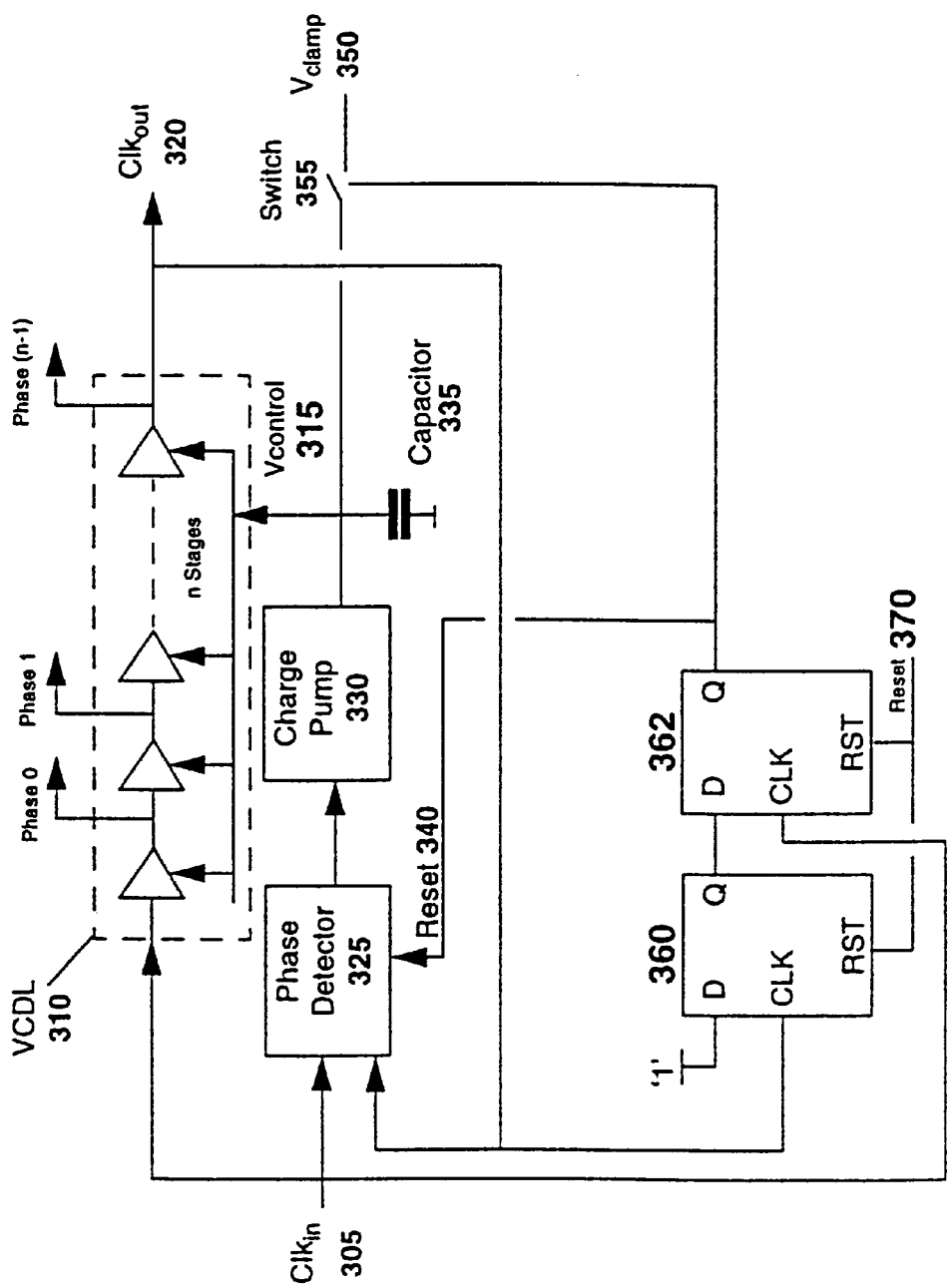
FIG. 3 illustrates an apparatus according to one embodiment of the invention.

FIG. 3 illustrates one embodiment of the invention which includes modifications which ensure that the DLL locks on the first attempt. A switch 355 is inserted between the capacitor 335 and a voltage source ($V_{clamp}$) 350. In addition, two flip-flops, 360 and 362, are configured to synchronize the reset signal 340.

A new reset signal 370 which is the synchronized form of the reset signal 370, ensures that the DLL will not be brought out of reset unless there is a delayed clock present and that the correct sequence of events occurs. Thus, if the delay is less than one period, the DLL is reset to a state in which the charge pump 330 properly decreases the control voltage 315. Conversely, if the delay is greater than one period, the DLL is reset to a state in which the charge pump increases the control voltage 315.

Figure 4:
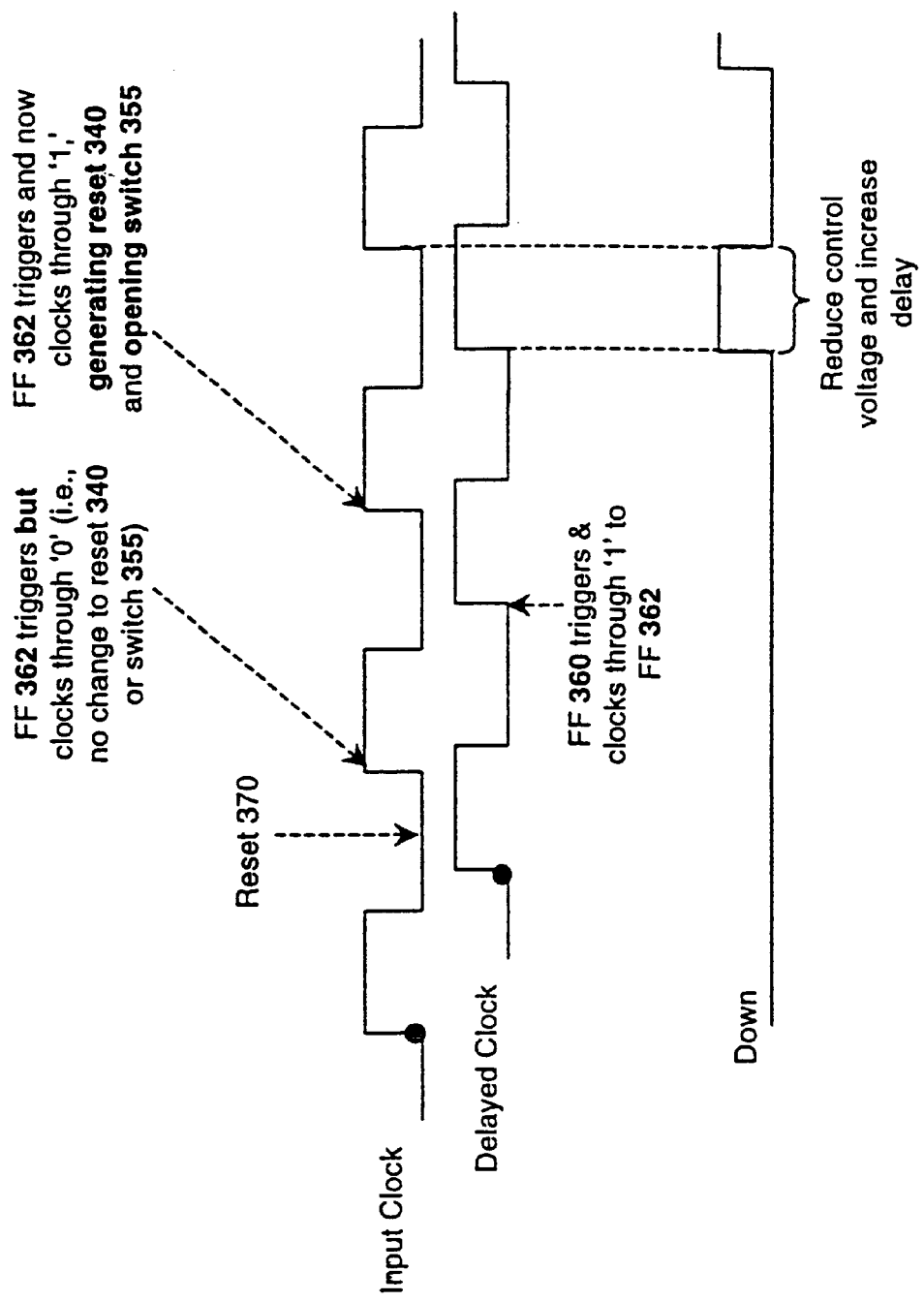
FIG. 4 is a timing diagram illustrating aspects of the apparatus illustrated in FIG. 3.

The operation of this embodiment of the invention will be described with reference to FIGS. 3 and 4. During reset 370 the outputs of the two flip-flops 360, 362 are forced low. Consequently, the capacitor voltage 315 is clamped to a value ($V_{clamp}$) 350 which sets the VCDL 310 delay to a value of less than one clock period. The delay clock 320 is initially out of phase relative to the input clock 305 as illustrated in FIG. 4. When the reset 370 is de-asserted, the following sequence is initiated.

When the first delayed clock appears, flip-flop 360 clocks through a logical '1' as illustrated (as indicated in FIG. 4, if the input clock triggers before the delay clock, it outputs a logical '0'). When the next input clock appears, flip-flop 362 clocks through the logical '1.' This resets the DLL via the synchronized reset 340, and also opens the switch 355 (i.e., disconnects the clamping voltage 350). Once the switch is opened, however, the capacitor will still hold the voltage 315.

Due to the foregoing timing constraints, the next clock edge received at the phase detector will be the delayed clock 350, and the DLL will operate as described with respect to FIG. 2b. The DLL will then continue to lock down towards one clock period until an equilibrium is reached (i.e., as shown in FIG. 2c) where the delay is equal to one input clock 305 period.

Figure 5:
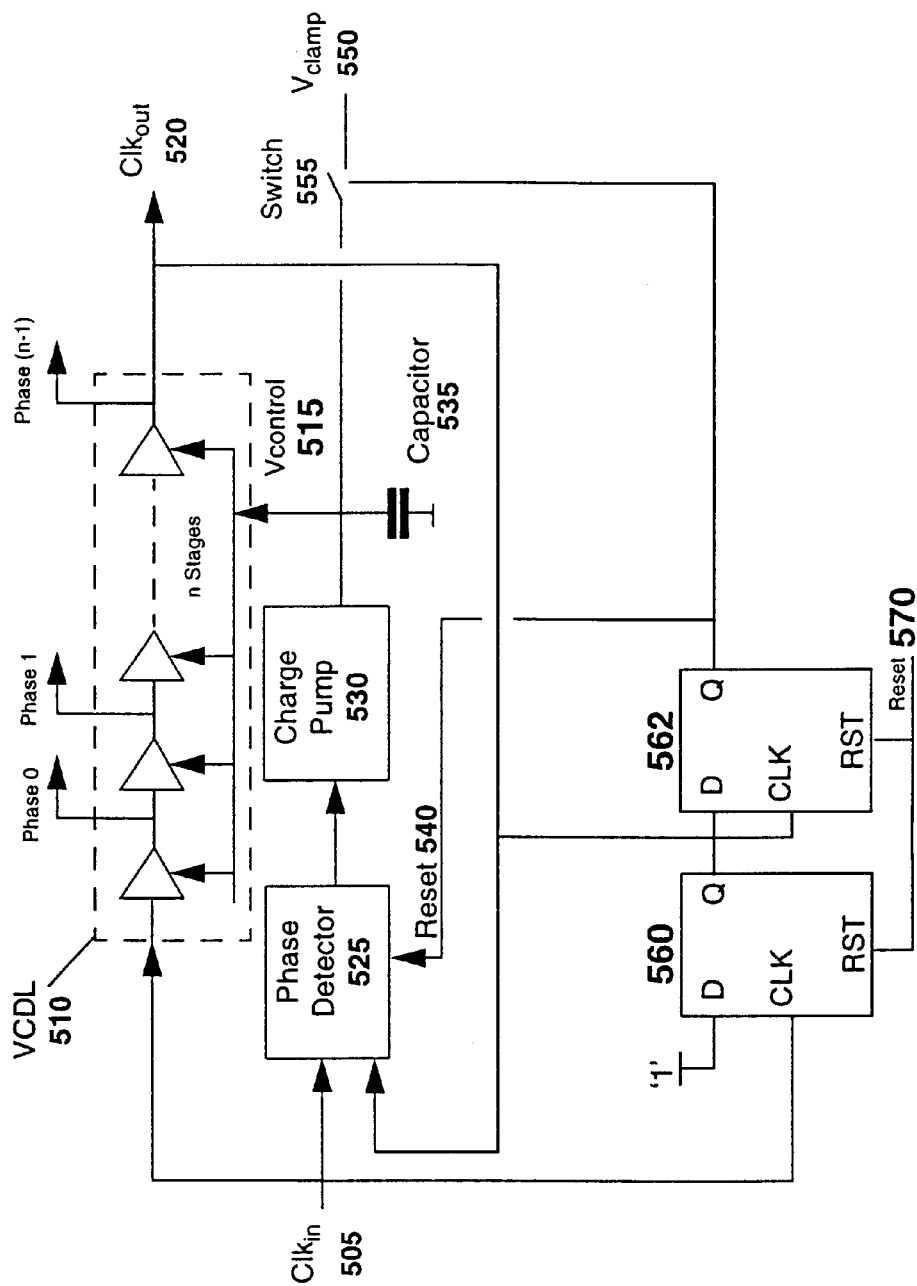
FIG. 5 illustrates an apparatus according to another embodiment of the invention.
Figure 6:
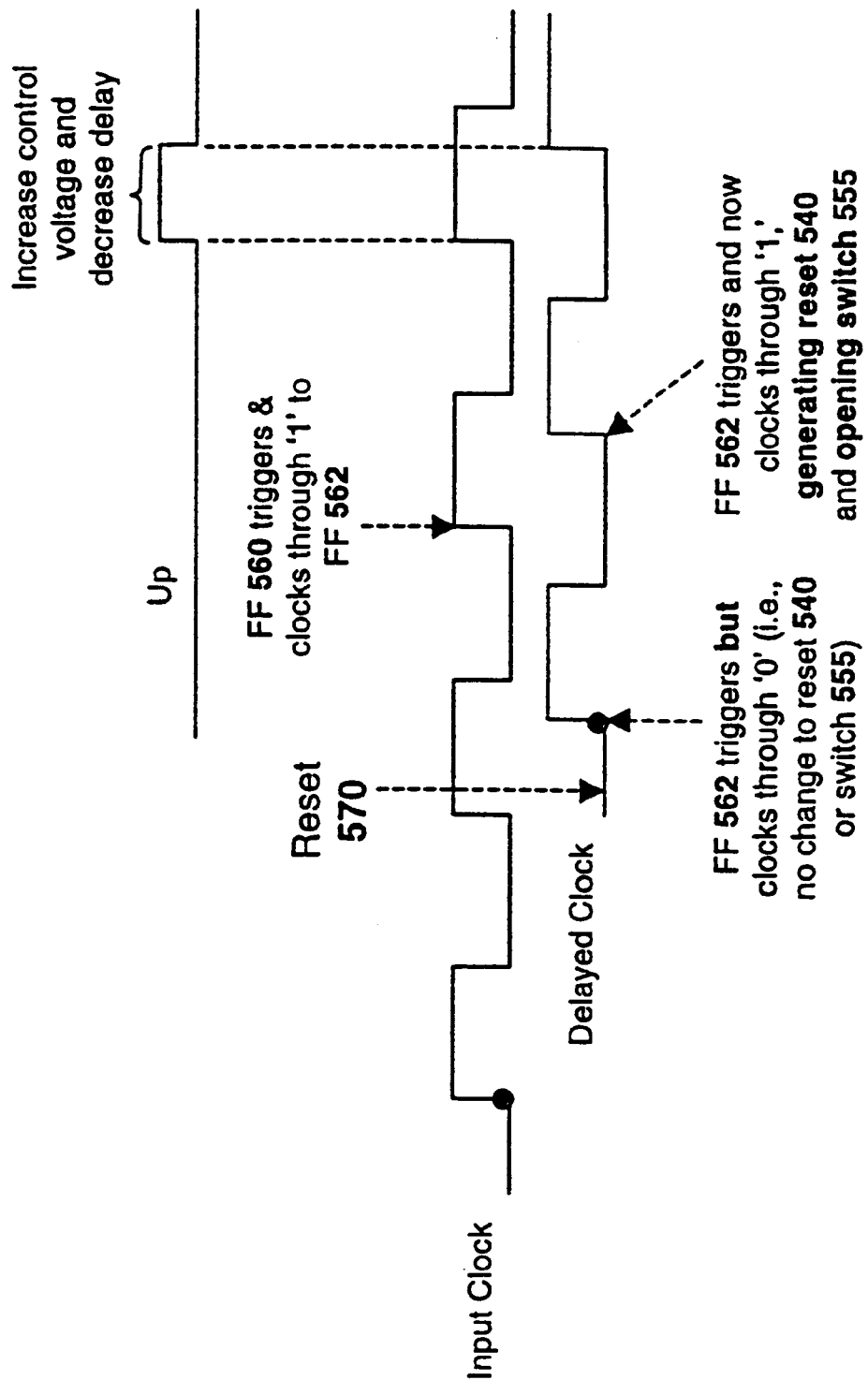
FIG. 6 is a timing diagram illustrating aspects of the apparatus illustrated in FIG. 5.

In another embodiment, which will now be described with respect to FIGS. 5 and 6, the capacitor voltage 515 is clamped to a value ($V_{clamp}$) 550 which sets the VCDL 510 delay to a value of between one and two clock periods. Thus, the delay clock 520 is initially out of phase relative to the input clock 505 as illustrated in FIG. 6. During reset 570 the outputs of the two flip-flops 560,562 are forced low. When the reset 570 is de-asserted, the following sequence is initiated.

When the first input clock appears, flip-flop 560 clocks through a logical '1' as illustrated (as indicated in FIG. 6, if the delay clock triggers before the input clock, it outputs a logical '0'). When the next delay clock appears, flip-flop 562 clocks through the logical '1.' This resets the DLL via the synchronized reset 540, and also opens the switch 555 (i.e., disconnects the clamping voltage 550). Once the switch is opened, however, the capacitor will still hold the voltage.

The next clock edge received at the phase detector will be the input clock 550, and the DLL will operate as described with respect to FIG. 2a. The DLL will then continue to lock down towards one clock period (i.e., by increasing the control voltage ($V_{control}$) 515 and decreasing the delay) until an equilibrium is reached (i.e., as shown in FIG. 2c) where the delay is equal to one input clock 505 period.

It is important to note that the apparatus and method described herein may be implemented in environments other than a physical integrated circuit ("IC"). For example, the circuitry may be incorporated into a format or machine-readable medium for use within a software tool for designing a semiconductor IC. Examples of such formats and/or media include computer readable media having a VHSIC Hardware Description Language ("VHDL") description, a Register Transfer Level ("RTL") netlist, and/or a GDSII description with suitable information corresponding to the described apparatus and method.

Throughout the foregoing description, for the purpose of explanation, numerous specific details were set forth in order to provide a thorough understanding of the invention. It will be apparent, however, to one skilled in the art that the invention may be practiced without some of these specific details. For example, while the embodiments described above locked on a one-period phase delay between the input clock and the delay clock, the underlying principles of the invention may be practiced without such a limitation.

Similarly, while the DLL components illustrated and described above (e.g., flip-flops 360, 362; phase detector 325 . . . etc) trigger on a rising clock edge, the principles of the invention may be implemented using components which trigger on falling clock edges, or using combinations of components which trigger on both rising and falling clock edges. Accordingly, the scope and spirit of the invention should be judged in terms of the claims which follow.

What is claimed is:

1. A delay locked loop (DLL) comprising:
   a delay unit configured to delay an input clock signal by a specified amount to produce a delayed clock signal, said specified amount controlled by a control voltage applied to said delay unit; and
   a switch configured to clamp said control voltage to a predetermined value when said DLL is reset.

2. The DLL in claim 1 wherein said predetermined value is selected such that said delay unit will delay said input clock by less than or equal to one period.

3. The DLL in claim 1 wherein said control voltage is held by a capacitor after said DLL is reset.

4. The DLL in claim 3 wherein said control voltage is modified by a charge pump.

5. The DLL in claim 4 wherein said charge pump increases said control voltage to decrease said delay and decreases said control voltage to increase said delay.

6. The DLL in claim 5 further comprising a phase detector for controlling said charge pump responsive to a detected phase difference between said input clock signal and said delayed clock signal.

7. The DLL in claim 6 wherein, responsive to control by said phase detector, said charge pump starts increasing said control voltage responsive to a first input clock edge received at said phase detector, and stops increasing said control voltage responsive to a first delayed clock edge received at said phase detector.

8. The DLL in claim 6 wherein, responsive to control by said phase detector, said charge pump starts decreasing said control voltage responsive to a first delayed clock edge received at said phase detector, and stops decreasing said control voltage responsive to a first input clock edge received at said phase detector.

9. The DLL in claim 6 further comprising reset timing logic for ensuring that said phase detector receives a first delayed clock edge before a first input clock edge following reset of said DLL.

10. The DLL as claimed in claim 9 wherein said reset timing logic comprises:
    a first flip-flop having an input coupled to a predetermined binary logic state and an output coupled to an input of a second flip-flop, said first flip-flop triggered by said output clock signal; and
    said second flip-flop triggered by said input clock signal, and having an output configured to reset said DLL and to close said switch, thereby clamping said control voltage, when said output is in said predetermined binary logic state.

11. The DLL as claimed in claim 10 wherein said first and second flip-flops each include a reset input for receiving a non-synchronized reset signal which, when triggered, forces said outputs of each of said flip-flops to a binary logic state opposite of said predetermined binary logic state.

12. The DLL in claim 6 further comprising reset timing logic for ensuring that said phase detector receives a first input clock edge before a first delayed clock edge following reset of said DLL.

13. The DLL as claimed in claim 12 wherein said reset timing logic comprises:
    a first flip-flop having an input coupled to a predetermined binary logic state and an output coupled to an input of a second flip-flop, said first flip-flop triggered by said input clock signal; and
    said second flip-flop triggered by said output clock signal, and having an output configured to reset said DLL and to close said switch, thereby clamping said control voltage, when said output is in said predetermined binary logic state.

14. The DLL as claimed in claim 13 wherein said first and second flip-flops each include a reset input for receiving a non-synchronized reset signal which, when triggered, forces said outputs of each of said flip-flops to a binary logic state opposite of said predetermined binary logic state.

15. A delay locked loop ("DLL") comprising:
    a delay unit comprising a clock input, a clock output and a control voltage input, said delay circuit configured to delay an input clock signal applied to said clock input and generate a delayed clock signal at said clock output, said delay corresponding to a control voltage applied to said control voltage input; and
    a switch positioned between said control voltage input and a clamping voltage source, said switch configured to electrically couple said clamping voltage source to said control voltage input when said DLL is reset.

16. The DLL of claim 15 further comprising a capacitor electrically coupled to said control voltage input, and configured to temporarily store said clamping voltage applied to said control voltage input after said switch de-couples said clamping voltage source from said control voltage input.

17. The DLL of claim 16 further comprising
    a phase detector having an input clock signal input and a delayed clock signal input, configured to detect phase differences between said delayed clock signal and said input clock signal; and
    a charge pump for modifying said voltage stored in said capacitor responsive to a control signal from said phase detector.

18. The DLL of claim 17 wherein said charge pump is configured to modify said voltage stored in said capacitor responsive to a phase difference between said input clock signal and said delayed clock signal detected by said phase detector.

19. The DLL of claim 18 wherein, responsive to control by said phase detector, said charge pump starts increasing said control voltage responsive to a first input clock edge received at said phase detector, and stops increasing said control voltage responsive to a first delayed clock edge received at said phase detector.

20. The DLL in claim 17 further comprising reset timing logic for ensuring that said phase detector receives a first delayed clock edge before a first input clock edge following reset of said DLL.

21. The DLL as claimed in claim 20 wherein said reset timing logic comprises:
    a first flip-flop having an input coupled to a predetermined binary logic state and an output coupled to an input of a second flip-flop, said first flip-flop triggered by said output clock signal; and said second flip-flop triggered by said input clock signal, and having an output configured to reset said DLL and to close said switch, thereby clamping said control voltage, when said output is in said predetermined binary logic state.

22. The DLL as claimed in claim 21 wherein said first and second flip-flops each include a reset input for receiving a non-synchronized reset signal which, when triggered, forces said outputs of each of said flip-flops to a binary logic state opposite of said predetermined binary logic state.

23. A machine-readable medium having code stored thereon which defines an integrated circuit (IC), said IC comprising:

a delay unit comprising a clock input, a clock output and a control voltage input, said delay circuit configured to delay an input clock signal applied to said clock input and generate a delayed clock signal at said clock output, said delay corresponding to a control voltage applied to said control voltage input; and a switch positioned between said control voltage input and a clamping voltage source, said switch configured to electrically couple said clamping voltage source to said control voltage input when said IC is reset.

24. The machine readable medium of claim 23 further comprising code which defines a capacitor electrically coupled to said control voltage input, and configured to temporarily store said clamping voltage applied to said control voltage input after said switch de-couples said clamping voltage source from said control voltage input.

25. The machine readable medium of claim 24 further comprising code which defines a phase detector having an input clock signal input and a delayed clock signal input, configured to detect phase differences between said delayed clock signal and said input clock signal; and a charge pump for modifying said voltage stored in said capacitor responsive to a control signal from said phase detector.

26. The machine readable medium of claim 25 wherein said charge pump is configured to modify said voltage stored in said capacitor responsive to a phase difference between said input clock signal and said delayed clock signal detected by said phase detector.

27. The machine readable medium of claim 25 wherein, responsive to control by said phase detector, said charge pump starts increasing said control voltage responsive to a first input clock edge received at said phase detector, and stops increasing said control voltage responsive to a first delayed clock edge received at said phase detector.

28. The machine readable medium of claim 27 further comprising code which defines reset timing logic for ensuring that said phase detector receives a first delayed clock edge before a first input clock edge following reset of said DLL.

29. The machine readable medium of claim 24 where in said reset timing logic comprises:

a first flip-flop having an input coupled to a predetermined binary logic state and an output coupled to an input of a second flip-flop, said first flip-flop triggered by said output clock signal; and said second flip-flop triggered by said input clock signal, and having an output configured to reset said DLL and to close said switch, thereby clamping said control voltage, when said output is in said predetermined binary logic state.

30. The machine readable medium of claim 24 further comprising code which defines where in s aid first and second flip-flops each include a reset input for receiving a non-synchronized reset signal which, when triggered, forces said outputs of each of said flip-flops to a binary logic state opposite of said predetermined binary logic state.

31. The machine readable medium of claim 23 wherein said code defining an IC is VHDL code.

32. The machine readable medium of claim 23 wherein said code defining an IC is Register Transfer Level ("RTL") netlist code.

33. The machine readable medium of claim 23 wherein said code defining an IC is GDSII code.

* * * * *